United States Patent [19]
Yamada

[11] Patent Number: 6,147,898
[45] Date of Patent: Nov. 14, 2000

[54] SEMICONDUCTOR STATIC RANDOM ACCESS MEMORY DEVICE WITH LOW POWER CONSUMPTION IN A WRITE OPERATION

[75] Inventor: Takashi Yamada, Tokyo, Japan

[73] Assignee: NEC Corporation, Tokyo, Japan

[21] Appl. No.: 09/263,089

[22] Filed: Mar. 8, 1999

[30] Foreign Application Priority Data

Mar. 6, 1998 [JP] Japan .................................. 10-055604

[51] Int. Cl.[7] .................................................. G11C 11/00
[52] U.S. Cl. ......................... 365/156; 365/190; 365/203
[58] Field of Search .................................... 365/154, 156, 365/189.11, 203, 190

[56] References Cited

U.S. PATENT DOCUMENTS

| | | | |
|---|---|---|---|
| 4,780,847 | 10/1988 | Ito | 365/154 |
| 5,491,661 | 2/1996 | Motomura | 365/156 |
| 5,523,966 | 6/1996 | Idei et al. | 365/156 |
| 5,771,190 | 6/1998 | Okamura | 365/154 |

FOREIGN PATENT DOCUMENTS

| | | | |
|---|---|---|---|
| 60-69891 | 4/1985 | Japan | G11C 11/34 |
| 09231768 | 9/1997 | Japan | G11C 11/413 |

*Primary Examiner*—Son Mai
*Attorney, Agent, or Firm*—McGinn & Gibb, P.C.

[57] ABSTRACT

There is disclosed an SRAM including a number of memory cells located in the form of a matrix. When data "0" is written to a memory cell 100, a precharge signal PC is brought to a high level so that a bit line D0 is brought into an electrically floating condition. A corresponding power switch 30 is turned off so that a pseudo-ground line SS0 is brought to an electrically floating condition. A corresponding equalizing transistor 20L is turned on so that the bit line having a power supply voltage Vdd as an initial potential and the pseudo-ground line SS0 having a ground voltage Vss as an initial potential are electrically connected to each other, so that the potential of the pseudo-ground line SS0 is elevated to a potential Veq which is determined by a ratio in capacitance of the bit line and the pseudo-ground line. As a result, the data holding capability of the memory cell 100 is lowered, and therefore, when a corresponding word line is pulled up, a latch in the memory cell 100 is quickly inverted, so that the writing operation is completed at a high speed. After the writing operation, the potential of the bit line D0 is returned to the initial potential Vdd. In this operation, since the potential of the bit line D0 was lowered only to the potential Veq, the potential of the bit line D0 is returned to the initial potential Vdd quickly with a reduced power consumption.

16 Claims, 6 Drawing Sheets

SEMICONDUCTOR STATIC RANDOM ACCESS MEMORY DEVICE WITH LOW POWER CONSUMPTION IN A WRITE OPERATION

BACKGROUND OF THE INVENTION

1. Field of the Invention

The present invention relates to a semiconductor memory, and more specifically to a static random access memory in which ground lines for a plurality of memory cells are located in parallel to bit lines.

2. Description of Related Art

Referring to FIG. 5, there is shown an electric circuit diagram illustrating a static random access memory (SRAM) ordinarily used in the prior art. As shown in FIG. 5, the SRAM includes a plurality of memory cells 100, 101, . . . , 110, 111, . . . , which are located in the form of a matrix. A ground (GND) terminal of each memory cell is grounded. Bit lines D0, D0 bar, D1, D1 bar, . . . (in this specification, "bar" indicates that an upper bar is given to an associated Reference Sign) are connected to precharge transistors 10L, 10R, 11L, 11R, . . . , respectively. In addition, the bit lines D0, D0 bar, D1, D1 bar, are connected through column selectors 120L, 120R, 121L, 121R, . . . , respectively, to common bit lines CD and CD bar, which are connected to outputs of a write driver 130, respectively.

Now, a write operation in the prior art SRAM shown in FIG. 5 will be described. In an initial condition, the bit lines D0, D0bar, D1, D1 bar, . . . are precharged to a power supply potential Vdd through the precharge transistors 10L, 10R, 11L, 11R, . . . , respectively. For example, in an operation for writing "0" into the memory cell 100, firstly, the precharge transistors 10L, 10R, 11L, 11R, . . . are turned off, and corresponding column selectors 120L and 120R are turned on. With this arrangement, the outputs of the write driver 130 determined in accordance with the value of a write data D1 reach to the bit lines D0 and D0 bar through the common bit lines CD and CD bar. In this example, since DI=0, the potential of the bit line D0 is pulled down to a ground potential Vss, and the potential of the bit line D0 bar is maintained at the initial value of Vdd. Therefore, if the word line WL0 is brought to a high level by an associated driver 40, the value of the memory cell 100 is rewritten to "0". After the completion of the writing, the potential of the bit line D0 is returned to Vdd by action of the precharge transistor 10L.

Referring to FIG. 6, there is shown an electric circuit diagram of an SRAM disclosed by Japanese Patent Application Pre-examination Publication No. JP-A-09-231768, (an English abstract of JP-A-09-231768 is available and the content of the English abstract of JP-A-09-231768 is incorporated by reference in its entirety into this application). The SRAM shown in FIG. 6 is different from the SRAM shown in FIG. 5 in that a power supply terminal VD0 and a ground terminal VS0 of the memory cells 100, 101, . . . are connected to output terminals of a cell power supply voltage control circuit 70, respectively, and a power supply terminal VD1 and a ground terminal VS1 of the memory cells 110, 111, . . . are connected to output terminals of a cell power supply voltage control circuit 71, respectively. The cell power supply voltage control circuits 70, 71, . . . supply the power supply voltage Vdd and the ground potential Vss to the power supply terminals VD0, VD1, . . . and the ground terminals VS0, VS1, . . ., respectively, when power supply potential control signals PVC0, PVC1, . . . are a low level. To the contrary, when the power supply potential control signals PVC0, PVC1, . . . are a high level, the cell power supply voltage control circuits 70, 71, . . . supply the power supply terminals VD0, VD1, . . . with a second high potential side power supply potential Vdds which is lower than the power supply voltage Vdd by a predetermined level, and also supply the ground terminals VS0, VS1, . . . with a second low potential side power supply potential Vg2 which is higher than the ground potential Vss by a predetermined level. In a writing operation, only the power supply potential control signal corresponding to the selected memory cell is brought to the high level, so that the potential of the power supply terminal of the selected memory cell is lowered and the potential of the ground terminal of the selected memory cell is elevated. With this arrangement, the data holding capability of the selected memory cell is lowered, so that the writing operation executed by the write driver 130 is sped up.

In the prior art SRAM shown in FIG. 5, as mentioned above, after the completion of the writing, the potential of the bit line D0 is returned to Vdd by action of the precharge transistor 10L. However, the capacitance of the bit line is large, the power consumption is large, and therefore, the delay time is correspondingly large.

On the other hand, in the prior art SRAM shown in FIG. 6, since the bit line written with "0" is finally pulled down to the ground potential Vss, the power consumption cannot be reduced. Rather, since the cell power supply voltage control circuit 70 requires a new power for driving the power supply line VD0 and the ground line VS0 of the selected memory cell 100, the power consumption becomes larger than that of the SRAM shown in FIG. 5.

Generally, since the prior art SRAM includes a number of memory cells, the capacitance of the bit lines and the capacitance of the power supply line and the ground line of the memory cells are very large. Therefore, there is a problem that it is not so easy to reduce the delay time and the power consumption for driving the memory.

SUMMARY OF THE INVENTION

Accordingly, it is an object of the present invention to provide a semiconductor memory which overcomes the above mentioned problems of the prior art.

Another object of the present invention is to provide a semiconductor memory capable of reducing the power consumption and of elevating the writing operation speed, by reducing the amplitude of the bit line in the writing operation.

The above and other objects of the present invention are achieved in accordance with the present invention by a semiconductor memory comprising a plurality of memory cells located in the form of a matrix, bit lines located in the memory cell matrix, ground lines for the memory cells and located in parallel to the bit lines, floating means for bringing a selected ground line of the ground lines into an electrically floating condition so as to make the selected ground line a pseudo-ground line, and connecting means for electrically connecting the pseudo-ground line connected to a selected memory cell, to a bit line to be written with "0", of bit lines connected to the selected memory cell when data is to be written to the selected memory cell.

In an embodiment of the semiconductor memory, the connecting means for electrically connecting the pseudo-ground line to the bit line is composed of a MOS transistor having a high threshold.

In another embodiment of the semiconductor memory, the pseudo-ground line is shared by a pair of memory cells adjacent to each other in a row direction.

In this embodiment, preferably, the connecting means for electrically connecting the pseudo-ground line to the bit line is composed of a MOS transistor having a high threshold. Furthermore, the bit line is shared by a pair of memory cells adjacent to each other in a row direction. In addition, the connecting means for electrically connecting the pseudo-ground line to the bit line is composed of a MOS transistor having a high threshold.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the semiconductor memory in accordance with the present invention will be described with reference to the drawings.

Figure 1:
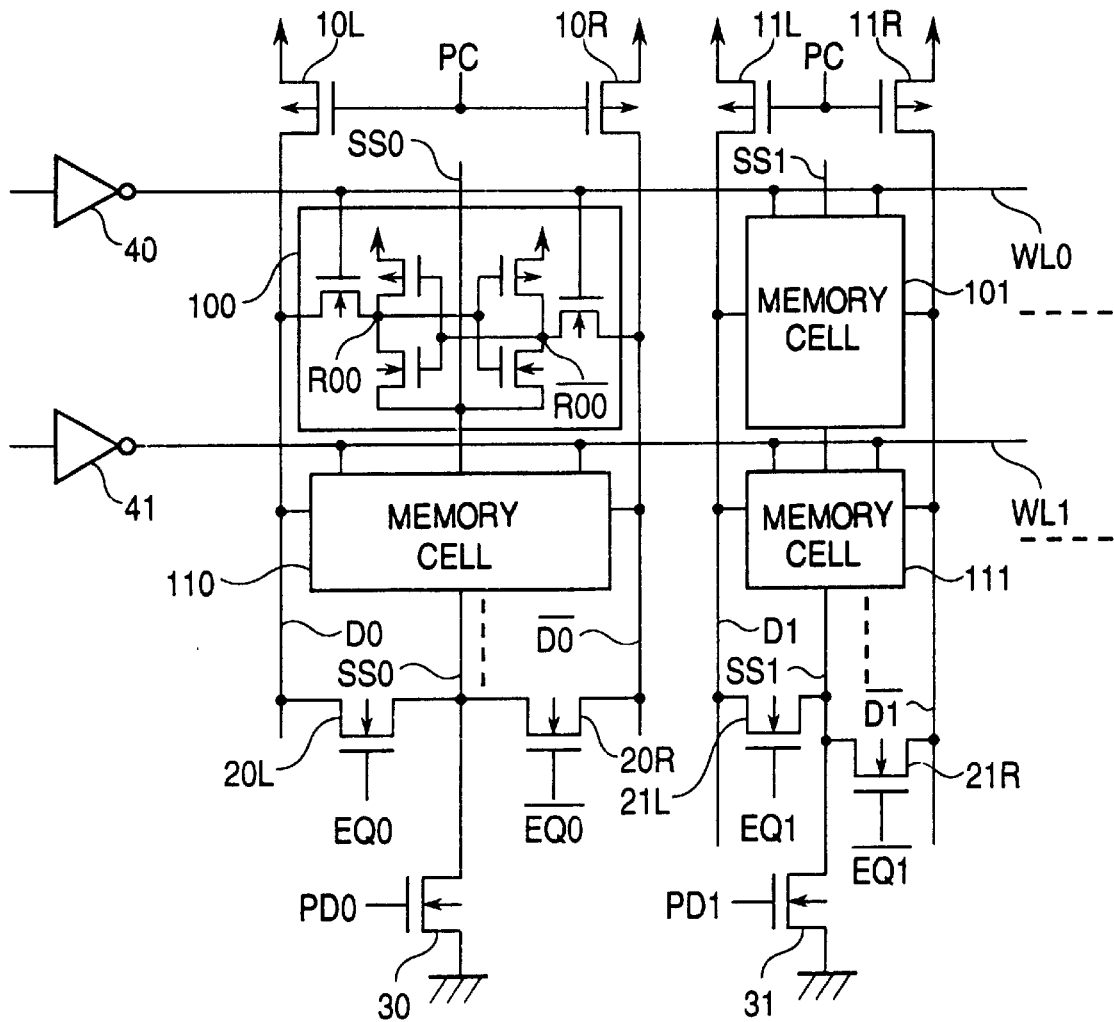
FIG. 1 is an electric circuit diagram illustrating a first embodiment of the SRAM in accordance with the present invention.
Figure 2:
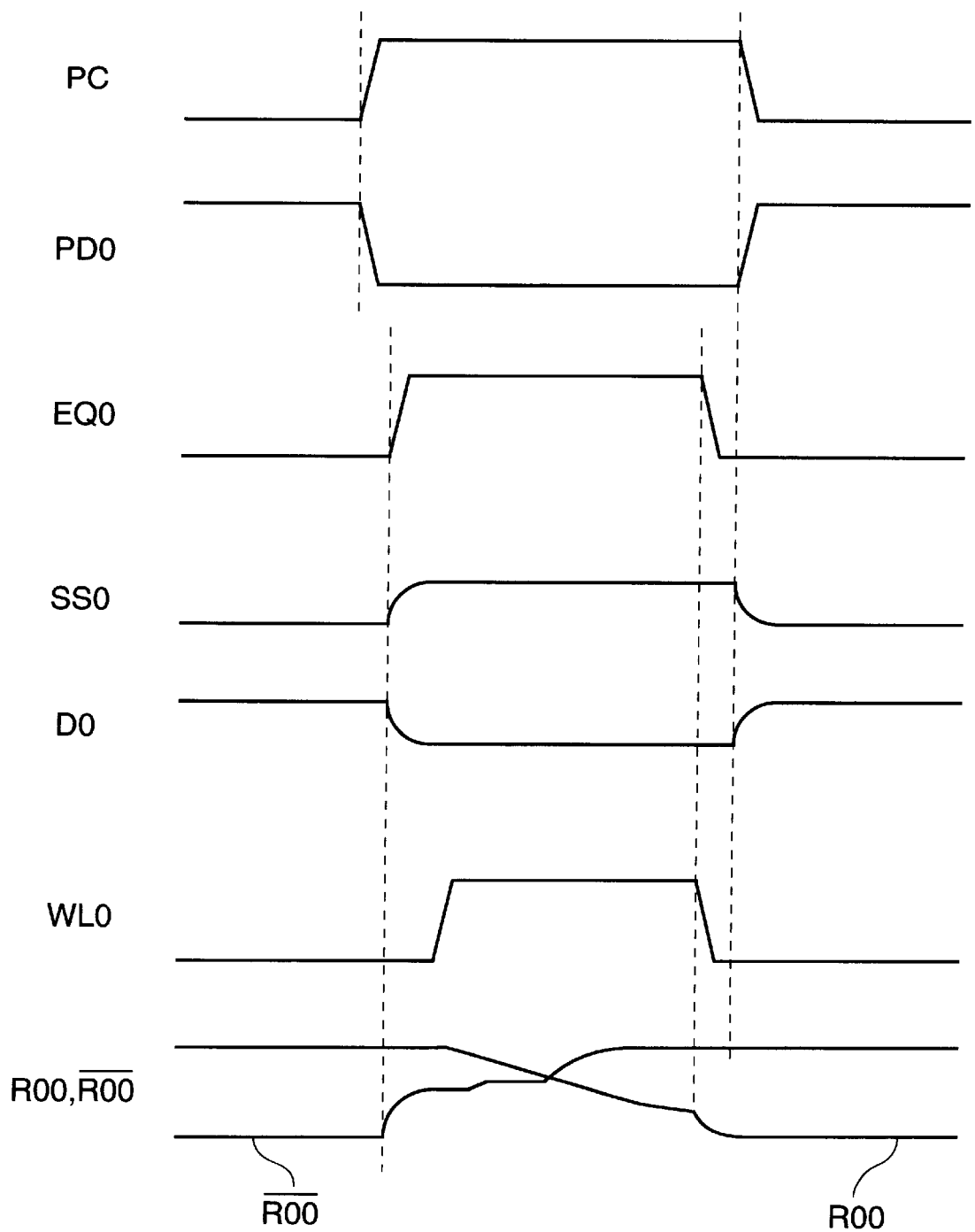
FIG. 2 is a waveform diagram for illustrating an operation of the first embodiment of the SRAM in accordance with the present invention.

Referring to FIG. 1, there is shown an electric circuit diagram illustrating a first embodiment of the SRAM in accordance with the present invention. FIG. 2 is a waveform diagram for illustrating an operation of the SRAM shown in FIG. 1.

As shown in FIG. 1, the SRAM includes a plurality of memory cells 100, 101, . . . , 110, 111, . . . which are located in the form of a matrix. A ground (GND) terminal of the memory cells 100, 110, . . . are connected to a pseudo-ground line SS0, and a ground terminal of the memory cells 101, 111, . . . are connected to a pseudo-ground line SS1. These pseudo-ground lines SS0, SS1, . . . are located in parallel to bit lines D0, D0 bar, D1, D1 bar, . . . , which are connected through precharge PMOS transistors 10L, 10R, 11L, 11R, . . . , respectively to a power supply line. A precharge signal PC is supplied to a gate of each of the precharge PMOS transistors 10L, 10R, 11L, 11R, . . . . The pseudo-ground line SS0 is connected through equalizing NMOS transistors 20L and 20R to the bit lines D0 and D0 bar, respectively, and the pseudo-ground line SS1 is connected through equalizing NMOS transistors 21L and 21R to the bit lines D1 and D1 bar, respectively. The pseudo-ground lines SS0, SS1, . . . are grounded through power switches 30, 31, . . . of an NMOS transistor, respectively.

In FIG. 1, when "0" is written to the memory cell 100, first, the precharge signal PC is brought to a high level, so that the bit line D0 is brought into an electrically floating condition. And, a corresponding power switch 30 is turned off by a signal PD0, so that the pseudo-ground line SS0 is brought into an electrically floating condition. Then, a corresponding equalizing NMOS transistor 20L is turned on by an equalizing signal EQ0, so that the bit line D0 (having an initial potential of the power supply potential Vdd) and the pseudo-ground line SS0 (having an initial potential of the ground potential Vss) are electrically connected to each other. As a result, the potential of the bit line D0 and the pseudo-ground line SS0 are settled at a value determined by Veq={(power supply potential Vdd)×(capacitance of bit line D0)}/{(capacitance of bit line D0)+(capacitance of pseudo-ground line SS0)}.

Therefore, since the potential of the pseudo-ground line SS0 is elevated by Veq, the data holding capability of the memory cell 100 is lowered, with the result that when a word line WL0 is pulled up by a driver 40, a latch in the memory cell is quickly inverted, so that the writing operation is completed at a high speed.

After completion of the writing, the equalizing transistor 20L is turned off, the power switch 30 is turned on, and the precharge transistors 10L and 10R are turned on, so that the potential of the bit line D0 is returned to the initial potential Vdd. Here, since the potential of the bit line D0 had been lowered to only Veq, the potential of the bit line D0 is returned to the initial potential Vdd, quickly and at a low power consumption.

Referring to FIG. 2, in the initial condition, the precharge signal PC is at the low level, and a column selection signal PD0 (PD1, . . . ) is at the high level. An equalizing signal EQ0 (EQ0 bar, EQ1, EQ1 bar, . . . ) is at the low level, and a row selection signal WL0 (WL1, . . . ) is at the low level. Therefore, the pseudo-ground line SS0 (SS1, . . . ) is at the ground level Vss, and the bit line D0 (D0 bar, D1, D1 bar, . . . ) is at the power supply potential Vdd.

Here, consider the writing operation to for example the memory cell 100. First, the precharge signal PC is brought to the high level. Then, by decoding an address supplied to the SRAM, only the column selection signal PD0 supplied to the gate of the power switch 30 associated to the pseudo-ground line SS0 is brought to the low level. Furthermore, of the two equalizing NMOS transistors 20L and 20R connected to the pseudo-ground line SS0, only the equalizing NMOS transistor 20L is turned on when "0" is to be written to the memory cell 100, or alternatively, only the equalizing NMOS transistor 20R is turned on when "1" is to be written to the memory cell 100. In this example, assuming that "0" is to be written, only the equalizing NMOS transistor 20L is turned on. Therefore, the pseudo-ground line SS0 and the bit line D0 are electrically connected to each other, so that the potential of the pseudo-ground line SS0 is elevated, and the potential of the bit line D0 is lowered. Here, assuming that a threshold of the equalizing NMOS transistor 20R is sufficiently small, the potential of both the bit line D0 and the pseudo-ground line SS0 become Veq={(power supply potential Vdd)×(capacitance of bit line D0)}/{(capacitance of bit line D0)+(capacitance of pseudo-ground line SS0)}. Therefore, since the potential of the pseudo-ground line SS0 is elevated to Veq, the data holding capability of the memory cells 100, 110, . . . is greatly lowered, and therefore, a noise margin is deteriorated. At this time, however, since all of the word lines WL0, WL1, . . . are still at the low level, this is not to a degree of destroying the stored data.

In this condition, if the word line WL0 is pulled up, the memory cell 100 is connected to a pair of complementary bit lines D0 and D0 bar. When the word line WL0 is at the high level, since the data holding capability of the memory cell 100 is actually greatly lowered, the potential Veq of the bit line D0 and the potential Vdd of the bit line D0 bar are inputted to storing nodes R00 and R00 bar in the memory cell 100, so that the logical value "0" is quickly written into the memory 100. In the SRAM, generally, since a delay time required by a word line decoder (column side decoding) is longer than a delay time required by a column decoder (row side decoding), the writing operation is carried out in the above mentioned sequence.

After the data writing to the memory cell 100 is completed, first, the word line WL0 is pulled down and the equalizing signal EQ0 is brought to the low level, so that the equalizing NMOS transistor 20L is turned off. Succeedingly, the column selection signal PD0 is brought to the high level, and the precharge signal PC is brought to the low level, so that the potential of the pseudo-ground line SS0 is returned to Vss and the potential of the bit line D0 is returned to Vdd. As mentioned above, since the potential of the bit line D0 was not lowered to Vss (namely, lowered only to Veq) in the writing operation, an electric power required to re-charge the bit line D0 is small, and therefore, the time for re-charging becomes short.

In the above mentioned embodiment, it has been described that the threshold of the equalizing transistors 20L, 20R, 21L, 21R, . . . are sufficiently small. When the threshold of the equalizing transistors 20L, 20R, 21L, 21R, . . . are high, the bit line becomes equilibrated in such a condition that the potential of the bit line equalized is higher than the potential of the pseudo-ground line by the value of the threshold. Therefore, in an extent capable of stably executing the writing operation, the threshold of the equalizing transistors can be made as high as possible, so that the electric power required to re-charge the bit line can be further reduced.

Figure 3:
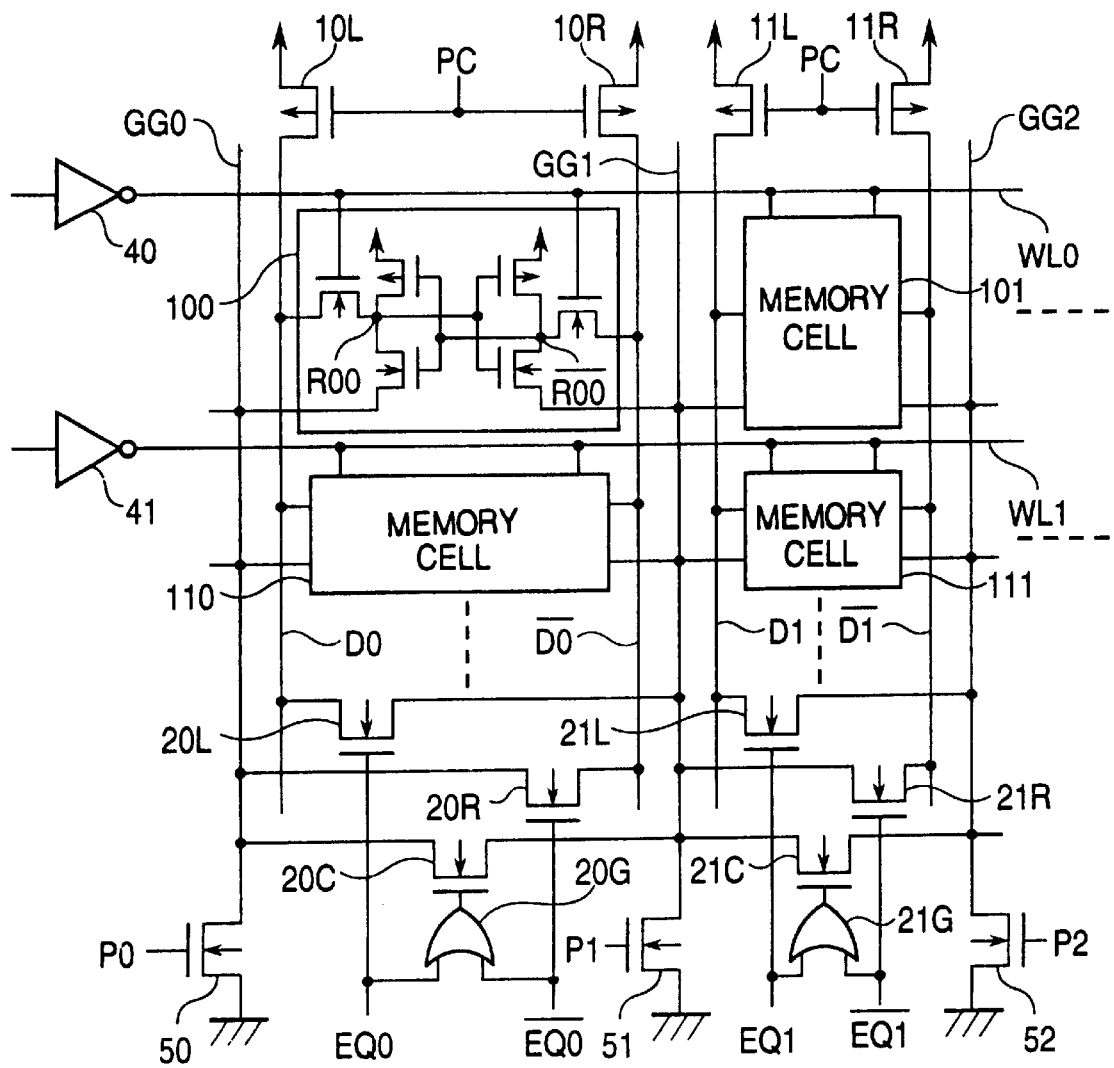
FIG. 3 is an electric circuit diagram illustrating a second embodiment of the SRAM in accordance with the present invention.

Referring to FIG. 3, there is shown an electric circuit diagram illustrating a second embodiment of the SRAM in accordance with the present invention. The SRAM shown in FIG. 3 is different from the SRAM shown in FIG. 1 in that the pseudo-ground line of the memory cell is shared by memory cells which are adjacent to each other in a row direction. In many cases, the SRAM shown in FIG. 3 in which each pseudo-ground line is shared by the adjacent memory cells, can be realized in a memory cell layout area smaller than that required in the SRAM shown in FIG. 1.

As shown in FIG. 3, a left side ground terminal of the memory cell 100 is connected to a pseudo-ground line GG0, and a right side ground terminal of the memory cell 100 is connected to a pseudo-ground line GG1. These two pseudo-ground lines GG0 and GG1 are electrically isolated from each other in each of the memory cells 100, 110, . . . . A pair of source/drain electrodes of the equalizing NMOS transistor 20L are connected to the bit line D0 and the pseudo-ground line GG1, a pair of source/drain electrodes of the equalizing NMOS transistor 20R are connected to the bit line D0 bar and the pseudo-ground line GG0, a pair of source/drain electrodes of the equalizing NMOS transistor 21L are connected to the bit line D1 and the pseudo-ground line GG2, a pair of source/drain electrodes of the equalizing NMOS transistor 21R are connected to the bit line D1 bar and the pseudo-ground line GG1, and so on. As seen from the bit line D0 and the pseudo-ground line GG1, and the bit line D0 bar and the pseudo-ground line GG0, shown in FIG. 3, a set of the pseudo-ground line and the bit line which are mutually connected through the equalizing transistor, are composed of the bit line and the pseudo-ground line which are never connected by source-drain paths of an access transistor and a driver transistor in the memory cell.

The second embodiment further includes equalizing transistors 20C, 21C . . . , and OR gates 20G, 21G, . . . , as shown in FIG. 3. Here, assuming that signals applied to a gate of the equalizing transistors 20L, 20R, 21L, 21R, . . . , are called EQ0, EQ0 bar, EQ1, EQ1 bar, . . . , respectively, the signals EQ0 and EQ0 bar are supplied to inputs of the OR gate 20G, the signals EQ1 and EQ1 bar are supplied to inputs of the OR gate 21G, and so on. An output of the OR gates 20G, 21G, . . . are connected to a gate of the equalizing transistors 20C, 21C, . . . , respectively. Namely, when either of the equalizing transistors 20L and 20R is on, the pseudo-ground lines GG0 and GG1 are connected to each other by the transistor 20C; when either of the equalizing transistors 21L and 21R is on, the pseudo-ground lines GG1 and GG2 are connected to each other by the transistor 21C; and so on.

Furthermore, similarly to the first embodiment, the pseudo-ground lines GG0, GG1 GG2, . . . are grounded through NMOS switches 50, 51, 52, . . . , respectively.

Now, an operation of the second embodiment of the SRAM will be described also with reference to FIG. 3. In the second embodiment of the SRAM, a writing operation is performed in a sequence similar to the first embodiment of the SRAM. However, for example, considering the writing operation for the memory cell 100, not only the gate signal P0 for the power switch 50 corresponding to the pseudo-ground line GG0 but also the gate signal P1 for the power switch 51 corresponding to the pseudo-ground line GG1 are brought to the low level. Furthermore, assuming that "0" is to be written, if the equalizing NMOS transistor 20L is turned on, not only the pseudo-ground line GG1 and the bit line D0 are electrically connected to each other, but also the pseudo-ground line GG0 is further electrically connected to the pseudo-ground line GG1 and the bit line D0 through the equalizing NMOS transistor 20C. Therefore, the potential of the pseudo-ground lines GG0 and GG1 are elevated, and the potential of the bit line D0 is lowered. At this time, the potential of these three lines becomes Veq2={(power supply potential Vdd)×(capacitance of bit line D0)}/{(capacitance of pseudo-ground line GG0)+(capacitance of pseudo-ground line GG1)+(capacitance of bit line D0)}. Since the potential of the pseudo-ground lines GG0 and GG1 are elevated to Veq2, the data holding capability of the memory cells 100, 101, 110, 111, . . . becomes lower, and therefore, the noise margin is deteriorated. In particular, since the word line WL0 is brought to the high level at a later stage, the deterioration in the noise margin of the memory cell 101 becomes larger than that in the other non-selected memory cell 110, 111, . . . . In this second embodiment, therefore, sufficient attention should previously be paid in a layout designing so as to ensure a sufficient noise margin even if the word line is selected so that the ground terminal of the memory cell connected to the selected word line is elevated to Veq2.

In this connection, if the word line WL0 is actually brought to the high level, the memory cell 100 is connected to the a pair of complementary bit lines D0 and D0 bar. In the condition in which the word line WL0 is at the high level and the ground terminal of the memory cell 100 is at a level higher than the ground level Vss, since the data holding capability of the memory cell 100 is lowered, if the potential Veq2 is supplied from the bit line D0 and the potential Vdd is supplied from the bit line D0 bar, the logic value "0" is quickly written into the memory cell 100.

In this second embodiment, since the potential Veq2 of the low level side bit line in the writing operation is lower than the potential Veq of the low level side bit line in the writing operation of the first embodiment, the second embodiment has the writing speed which is higher than that of the first embodiment.

However, as mentioned above, the noise margin of the memory cell 101 which is adjacent to the selected memory cell 100 and which is connected to the word line WL0 connected to the selected memory cell 100, is deteriorated in comparison with the first embodiment. On the other hand, since the potential of the bit line is lowered to Veq2 in the writing operation, the power consumption of the second embodiment is smaller than that of the first embodiment.

Figure 4:
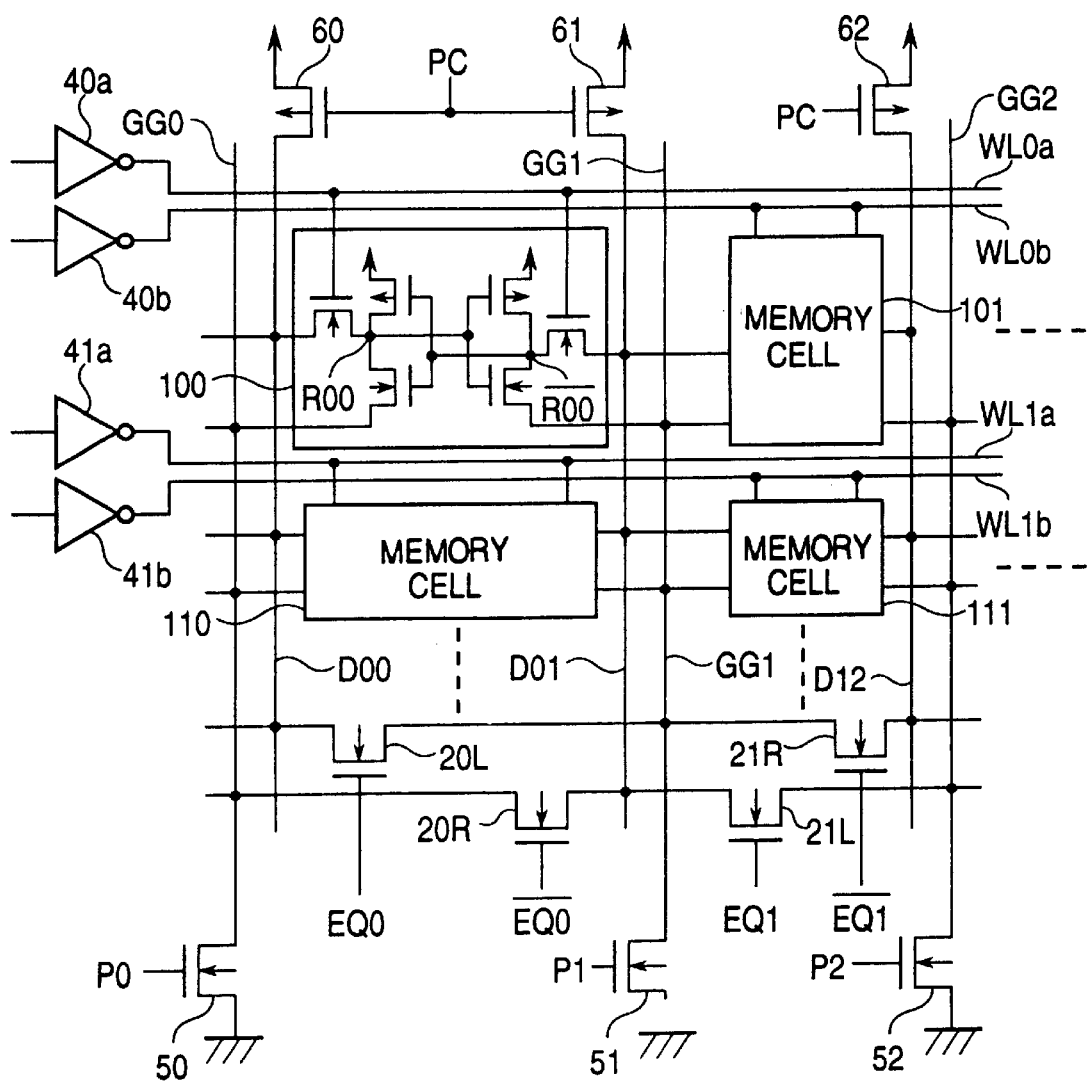
FIG. 4 is an electric circuit diagram illustrating a third embodiment of the SRAM in accordance with the present invention.
Figure 5:
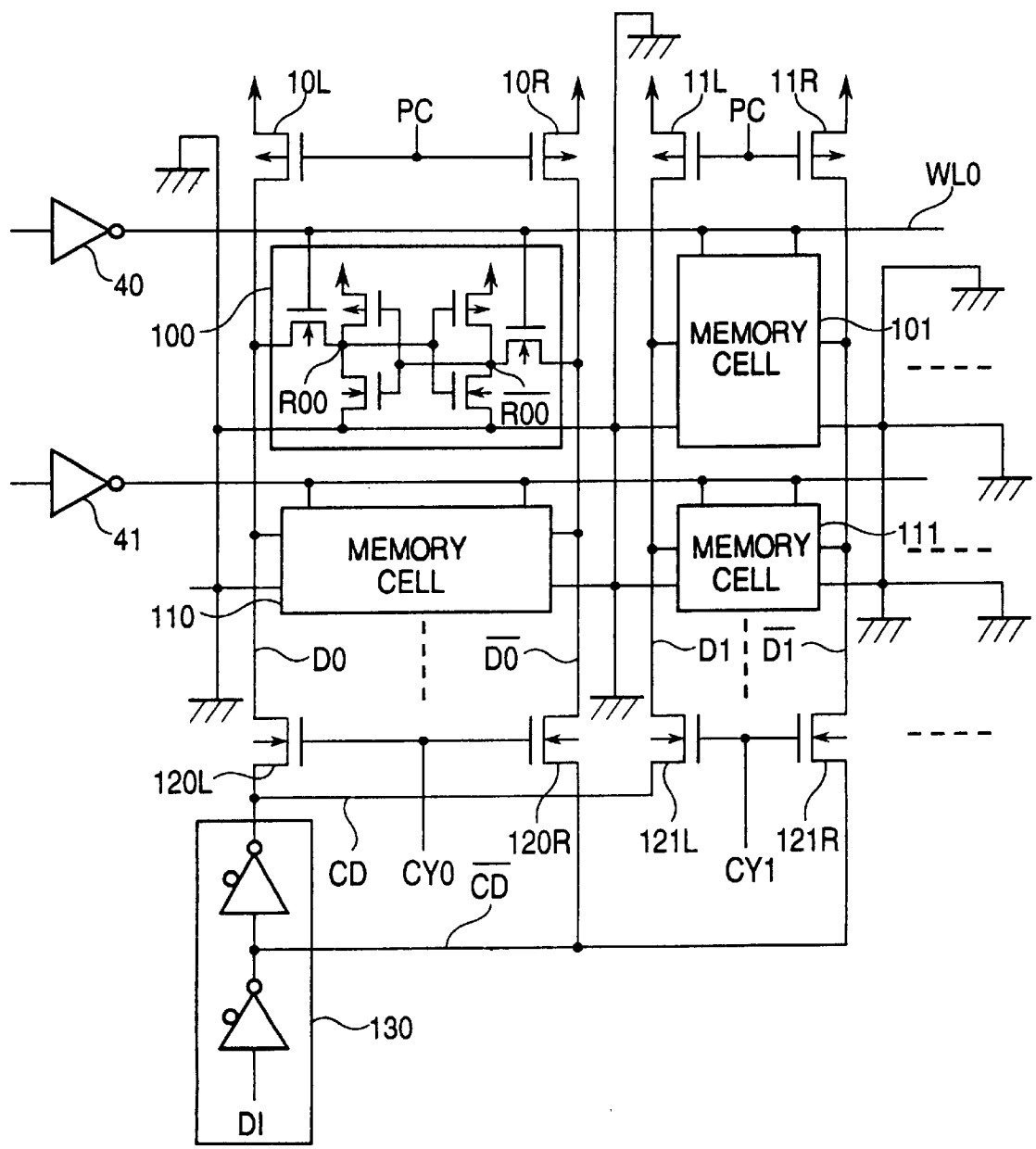
FIG. 5 is an electric circuit diagram illustrating one example of the prior art SRAM.
Figure 6:
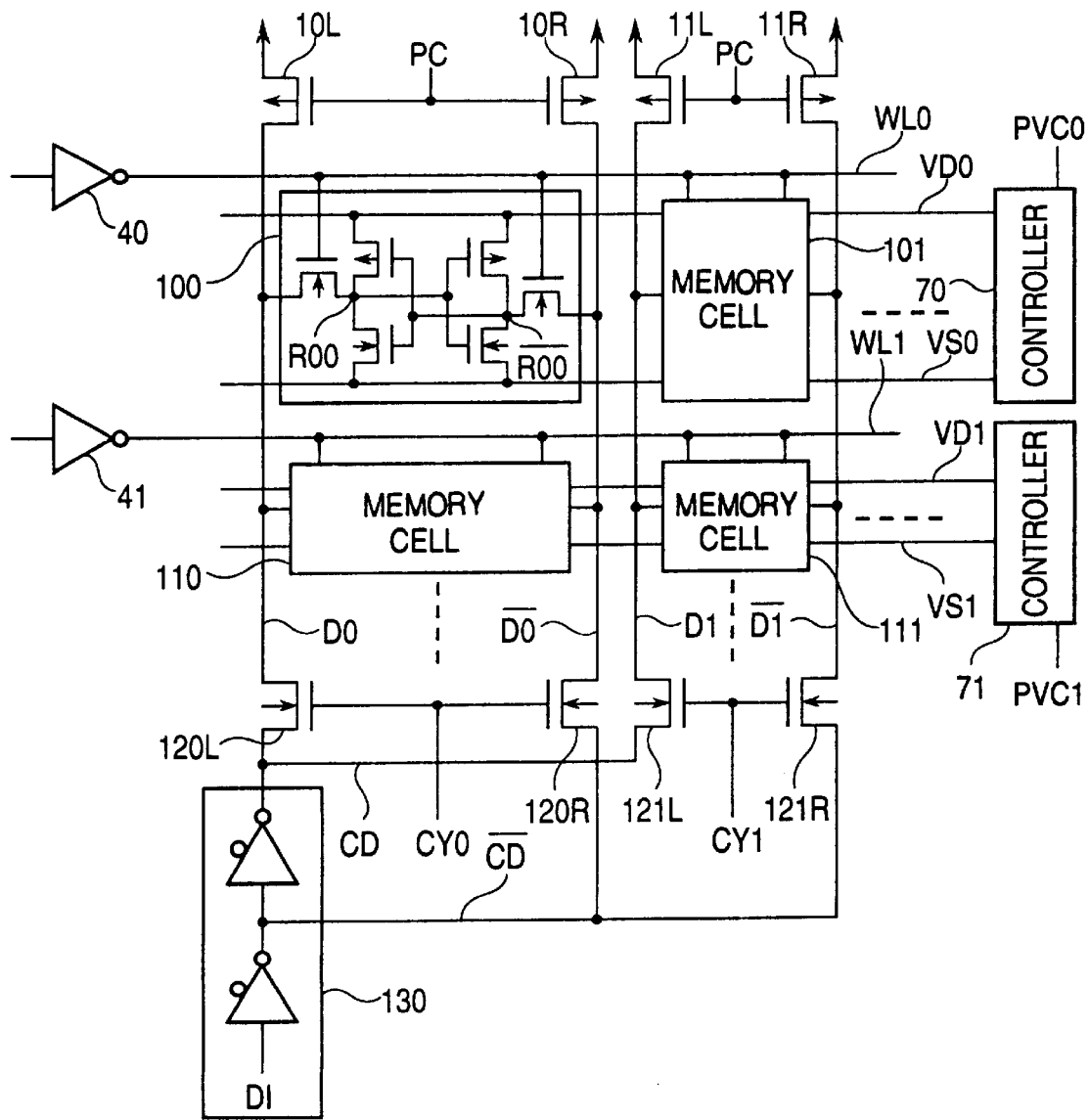
FIG. 6 is an electric circuit diagram illustrating another example of the prior art SRAM.

Referring to FIG. 4, there is shown an electric circuit diagram illustrating a third embodiment of the SRAM in accordance with the present invention. The SRAM shown in FIG. 3 is one in which the present invention is applied to a semiconductor memory disclosed in Japanese Patent Application Pre-examination Publication No. JP-A-60-069891. The SRAM shown in FIG. 3 has possibility that the memory cell area can be reduced in comparison with the second embodiment of the SRAM.

As shown in FIG. 4, the third embodiment includes pseudo-ground lines GG0, GG1, GG2, . . . each shared by adjacent memory cells, in accordance with a connection rule similar to that of the second embodiment. In addition, similarly to the pseudo-ground lines, each of bit lines D00, D01, D02, . . . is shared by adjacent memory cells. Word lines of the number which is two times that required in the first and second embodiments, are located in such a manner that one group of word lines are connected to only the memory cells of even-numbered columns, and the other group of word lines are connected to only the memory cells of odd-numbered columns. For example, a word line WL0$a$ is connected to only the memory cells 100, etc. of odd-numbered columns in a first row, and a word line WL0$b$ is connected to only the memory cells 101, etc. of even-numbered columns in the same first row.

Similarly to the first and second embodiments, in an initial condition, the bit lines D00, D01, D02, D03, . . . are connected to the power supply voltage through precharge transistors 60, 61, 62, . . . , respectively, and the pseudo-ground lines GG0, GG1, GG2, . . . are grounded through power switches 50, 51, 52, . . . of an NMOS transistor, respectively.

Now, an operation of the third embodiment will be described. When "0" is written to for example the memory 100, the precharge signal PC is brought to the high level, and the gate signal P1 for the power switch 51 is brought to the low level, so that the pseudo-ground line GG1 and the bit line D00 are brought into an electrically floating condition. Succeedingly, the equalizing signal EQ0 is brought to the high level, so that the pseudo-ground line GG1 and the bit line D00 are connected to each other. With this arrangement, the potential of both these lines becomes {(power supply potential Vdd)×(capacitance of bit line D00)}/{(capacitance of pseudo-ground line GG1)+(capacitance of bit line D0)}. Thus, the writing is executed quickly.

In the third embodiment of the SRAM, since the memory cell is selected only alternately in the word line direction, differently from the second embodiment, the noise margin of the adjacent memory cell is not so deteriorated comparably to the second embodiment. In addition, the power consumption can be reduced further in comparison with the second embodiment.

As seen from the above, according to the present invention, since the memory cell writing can be executed even if the potential of the bit line which should be lowered to the low level in the writing operation is not lowered to the ground potential Vss, the power for the precharge just after the writing operation can be reduced, with the result that the power consumption can be reduced.

In general, since the capacitance of the bit line in the SRAM is as large as a few pF, a major portion of the consumed power in the writing operation is occupied by the charging power for the bit line. Therefore, the power consumption of the SRAM can be effectively reduced by the present invention.

Furthermore, in the SRAM in accordance with the present invention, when the potential of the ground terminal of the selected memory cell is driven to the potential higher than the ground potential Vss, since the electric charge of the bit line is re-used, the consumed power at this time can be made substantially zero.

In addition, according to the present invention, when the word line is elevated, since the data holding capability of the memory cell to be written with data, has been already lowered, the data writing becomes easy, and therefore, the writing time can be shortened.

Furthermore, according to the present invention, since the potential of the bit line is never lowered to the ground potential Vss in the writing operation, the precharge time just after the writing operation can be reduced.

In addition, according to the present invention, the potential of the pseudo-ground line and the low level side bit line at the time of the writing is determined by {(power supply potential Vdd)+(capacitance of bit line)}/{(capacitance of pseudo-ground line)+(capacitance of bit line)}. Therefore, even if the width of wiring conductors is thickened or thinned because of variation in exposure time for patterning the wiring conductors, since the pseudo-ground lines and the bit lines are thickened or thinned similarly to each other, variation of the writing potential can be suppressed. Similarly, even if variation occurs in a diffused layer capacitance, the variation of diffused layer capacitance equally influences to both the pseudo-ground lines and the bit lines, the influence can be mutually canceled. Therefore, the present invention is resistive to variation in the manufacturing process.

Furthermore, according to the present invention, since the power required to re-charge the bit line is small, generation of noise is suppressed in the writing operation.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor memory comprising:

a plurality of memory cells located in the form of a matrix, said memory cells comprising a plurality of bit lines;

a plurality of ground lines connected to the memory cells and parallel to the bit lines;

floating means for bringing a selected ground line of the plurality of ground lines into an electrically floating condition so as to make the selected ground line a pseudo-ground line; and connecting means for electrically connecting said pseudo-ground line to a selected bit line of said plurality of bit lines to be written with "0", when data is to be written to said selected memory cell.

2. The semiconductor memory claimed in claim 1, wherein said connecting means for electrically connecting said pseudo-ground line to said bit line comprises a metal oxide semiconductor (MOS) transistor having a high threshold.

3. A semiconductor memory comprising:
a plurality of memory cells located in the form of a matrix, said memory cells comprising a plurality of bit lines;
a plurality of ground lines connected to the memory cells and parallel to the bit lines;
floating means for bringing a selected ground line of the plurality of ground lines into an electrically floating condition so as to make the selected ground line a pseudo-ground line; and
connecting means for electrically connecting said pseudo-ground line to a selected bit line of said plurality of bit lines to be written with "0", when data is to be written to said selected memory cell,
wherein said pseudo-ground line is shared by a pair of memory cells adjacent to each other in a row direction.

4. The semiconductor memory claimed in claim 3, wherein said connecting means for electrically connecting said pseudo-ground line to said bit line comprises a MOS transistor having a high threshold.

5. A semiconductor memory, comprising:
a plurality of memory cells located in the form of a matrix, said memory cells comprising a plurality of bit lines;
a plurality of ground lines connected to the memory cells and parallel to the bit lines;
floating means for bringing a selected ground line of the plurality of ground lines into an electrically floating condition so as to make the selected ground line a pseudo-ground line; and
connecting means for electrically connecting said pseudo-ground line to a selected bit line of said plurality of bit lines to be written with "0" when data is to be written to said selected memory cell,
wherein said selected bit line is shared by a pair of memory cells adjacent to each other in a row direction.

6. The semiconductor memory claimed in claim 5, wherein said connecting means for electrically connecting said pseudo-ground line to said bit line comprises a metal oxide semiconductor (MOS) transistor having a high threshold.

7. A semiconductor memory comprising:
a plurality of memory cells comprising a plurality of bit lines;
a plurality of ground lines connected to the memory cells;
a floating unit for bringing a selected ground line of the plurality of ground lines into an electrically floating condition so as to make the selected ground line a pseudo-ground line; and
a connector for electrically connecting said pseudo-ground line to a selected bit line of said plurality of bit lines to be written with a predetermined value, when data is to be written to said selected memory cell,
wherein said selected bit line is shared by a pair of memory cells.

8. The semiconductor memory claimed in claim 7, wherein said connector for electrically connecting said pseudo-ground line to said bit line comprises a metal oxide semiconductor (MOS) transistor.

9. A semiconductor memory comprising:
a plurality of memory cells comprising a plurality of bit lines;
a plurality of ground lines connected to the memory cells;
a floating unit for bringing a selected ground line of the plurality of ground lines into an electrically floating condition so as to make the selected ground line a pseudo-ground line; and
a connector for electrically connecting said pseudo-ground line to a selected bit line of said plurality of bit lines to be written with a predetermined value, when data is to be written to said selected memory cell, and
wherein said pseudo-ground line is shared by a pair of memory cells.

10. The semiconductor memory claimed in claim 9, wherein said connector for electrically connecting said pseudo-ground line to said bit line comprises a metal oxide semiconductor (MOS) transistor.

11. A semiconductor static random access memory (SRAM) device comprising:
a memory cell array comprising a number of memory cells arranged in rows and in columns;
a plurality of pairs of bit lines connected to said memory cells, each pair of said plurality of bit lines being shared among said memory cells arranged in a column, and said bit lines being parallel to each other;
a plurality of pseudo-ground lines connected to said memory cells, each of said pseudo-ground lines being shared among said memory cells arranged in a column, said pseudo-ground lines being parallel to each other and being parallel to said bit lines;
floating means for electrically disconnecting a selected one of said pseudo-ground lines from a physical ground line; and
connecting means for electrically equalizing said selected pseudo-ground line to the bit line written with "0" of a selected pair among said bit lines.

12. The semiconductor SRAM device claimed in claim 11, wherein each of said pseudo-ground lines is shared between adjacent columns to each other in a row direction.

13. The semiconductor SRAM device claimed in claim 12, wherein each of said bit lines is shared between adjacent columns to each other in a row direction.

14. The semiconductor SRAM device claimed in claim 11, wherein each of said bit lines is shared between adjacent columns to each other in a row direction.

15. The semiconductor SRAM device claimed in claim 11, wherein said connecting means comprises metal oxide semiconductor (MOS) transistors with a high threshold voltage.

16. A semiconductor SRAM device comprising:
a plurality of units each of which comprises:
a memory cell array including a plurality of memory cells arranged in rows and in columns;
a plurality of pairs of bit lines connected to said memory cells, each pair of bit lines being shared among said memory cells arranged in a column, and said bit lines being parallel to each other;
a plurality of pseudo-ground lines connected to said memory cells, each of said pseudo-ground lines being shared among said memory cells arranged in a column, said pseudo-ground lines being parallel to each other and being parallel to said bit lines;
floating means for electrically disconnecting a selected one of said pseudo-ground lines from a physical ground line; and
connecting means for electrically equalizing said selected pseudo-ground line to the bit line written with "0" of a selected pair among said bit lines, and
wherein a plurality of pairs of bit lines and a plurality of pseudo-ground lines are simultaneously selected.

* * * * *